United States Patent
Cheng et al.

(10) Patent No.: US 9,865,469 B2
(45) Date of Patent: Jan. 9, 2018

(54) EPITAXIAL LIFT-OFF PROCESS WITH GUIDED ETCHING

(71) Applicant: International Business Machines Corporation, Armonk, NY (US)

(72) Inventors: Cheng-Wei Cheng, White Plains, NY (US); Ning Li, White Plains, NY (US); Devendra K. Sadana, Pleasantville, NY (US); Leathen Shi, Yorktown Heights, NY (US); Kuen-Ting Shiu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/430,722

(22) Filed: Feb. 13, 2017

(65) Prior Publication Data
US 2017/0154783 A1 Jun. 1, 2017

Related U.S. Application Data

(63) Continuation of application No. 14/839,755, filed on Aug. 28, 2015.

(51) Int. Cl.
*H01L 21/306* (2006.01)
*H01L 21/02* (2006.01)
(Continued)

(52) U.S. Cl.
CPC .... *H01L 21/30617* (2013.01); *H01L 21/0262* (2013.01); *H01L 21/0273* (2013.01);
(Continued)

(58) Field of Classification Search
CPC ......... H01L 21/30617; H01L 21/02395; H01L 21/02463; H01L 21/02538; H01L 21/0273;
(Continued)

(56) References Cited

U.S. PATENT DOCUMENTS 4,512,825 A 4/1985 Addamiano et al.
8,796,120 B2 8/2014 Cheng et al.
(Continued)

FOREIGN PATENT DOCUMENTS

JP 2000106355 A 4/2000
JP 2003229473 B2 8/2003
(Continued)

OTHER PUBLICATIONS

Lee et al. ("Thin Film GaAs Solar Cells on Glass Substrates by Epitaxial Liftoff," Photovoltaic Specialists Conference, Conference Record of the Twenty Fifth IEEE, Jul. 1996).*

(Continued)

*Primary Examiner* — Yasser A Abdelaziez
(74) *Attorney, Agent, or Firm* — Louis J. Percello, Esq.; Otterstedt, Ellenbogen & Kammer, LLP

(57) ABSTRACT

A method for performing epitaxial lift-off allowing reuse of a III-V substrate to grow III-V devices is presented. A sample is received comprising a growth substrate with a top surface, a sacrificial layer on the top surface, and a device layer on the sacrificial layer. This substrate is supported inside a container and the container is filled with a wet etchant such that the wet etchant progressively etches away the sacrificial layer and the device layer lifts away from the growth substrate. While filling the container with the wet etchant, the sample is supported in the container such that the top surface of the growth substrate is non-parallel with an uppermost surface of the wet etchant. Performed in this manner, the lift-off process requires little individual setup of the sample, and is capable of batch processing and high throughput.

18 Claims, 5 Drawing Sheets

(51) Int. Cl.
*H01L 29/201* (2006.01)
*H01L 21/78* (2006.01)
*H01L 21/67* (2006.01)
*H01L 21/027* (2006.01)
*H01L 21/683* (2006.01)
*H01L 29/20* (2006.01)

(52) U.S. Cl.
CPC .. *H01L 21/02395* (2013.01); *H01L 21/02463* (2013.01); *H01L 21/02488* (2013.01); *H01L 21/02538* (2013.01); *H01L 21/02546* (2013.01); *H01L 21/02664* (2013.01); *H01L 21/30612* (2013.01); *H01L 21/67086* (2013.01); *H01L 21/6835* (2013.01); *H01L 21/6836* (2013.01); *H01L 21/7813* (2013.01); *H01L 29/20* (2013.01); *H01L 29/201* (2013.01); *H01L 2221/6835* (2013.01); *H01L 2221/68381* (2013.01)

(58) Field of Classification Search
CPC ........... H01L 21/67086; H01L 21/6835; H01L 21/6836; H01L 29/20; H01L 2221/6835; H01L 2221/68381
See application file for complete search history.

(56) References Cited

U.S. PATENT DOCUMENTS

| | | | |
|---|---|---|---|
| 9,041,027 | B2 | 5/2015 | Ptak et al. |
| 9,064,810 | B2 | 6/2015 | Archer |
| 2010/0151689 | A1 | 6/2010 | Gmitter et al. |
| 2012/0142170 | A1 | 6/2012 | Teng et al. |
| 2015/0166405 | A1 | 6/2015 | Murata et al. |

FOREIGN PATENT DOCUMENTS

| | | |
|---|---|---|
| JP | 5576273 A | 8/2014 |
| WO | 2014011954 A1 | 1/2014 |
| WO | 2014025068 A2 | 2/2014 |

OTHER PUBLICATIONS

Cheng, C-W et al., Epitaxial lift-off process for gallium arsenide substrate reuse and flexible electronics, Nature Communications, Mar. 12, 2013, DOI: 10.1038/ncomms2583, pp. 1-7, MacMillan Publishers Ltd, USA.

* cited by examiner

EPITAXIAL LIFT-OFF PROCESS WITH GUIDED ETCHING

CROSS-REFERENCE TO RELATED APPLICATIONS

The present application is a continuation of U.S. patent application Ser. No. 14/839,755, filed on Aug. 28, 2015, having the same title and inventors as the present application, the disclosure of which is hereby incorporated by reference herein in its entirety for all purposes.

FIELD

The present invention relates generally to the electrical, electronic, and computer arts, and, more particularly, to methods for performing epitaxial lift-off, and devices formed thereby.

BACKGROUND

Gallium arsenide substrates are frequently utilized when forming devices with III-V materials because these substrates allow III-V films to be grown epitaxially in a lattice-matched manner and thus with few defects. Nevertheless, gallium arsenide substrates are expensive, and it is frequently not cost effective to utilize such substrates only one time. Epitaxial lift-off (ELO) is one processing scheme that allows a gallium arsenide substrate to be used several times. In a typical ELO process, a thin sacrificial aluminum arsenide layer is grown on a gallium arsenide growth substrate, and then several III-V thin films are epitaxially grown on the sacrificial aluminum arsenide layer to produce a device layer. The device layer is then further processed to form the desired devices. With the devices formed, reuse of the gallium arsenide growth substrate is afforded by selectively etching away the aluminum arsenide sacrificial layer in hydrofluoric acid so as to undercut the device layer and allow it to be lifted away. The liberated device layer may then be re-attached to some other substrate, which need no longer be a substrate capable of supporting epitaxial III-V growth. The original gallium arsenide growth substrate is left intact and undamaged, and available for reuse.

Nevertheless, despite their promise, ELO processes may suffer from several disadvantages. For example, when etching the sacrificial layer to lift off the device layer from the growth substrate, it is often necessary to create curvature in the sample in order to allow a reasonable lateral diffusion rate of etchant to the etching front and to prevent the etching from stopping due to the buildup of gaseous byproducts from the etching process. Such curvature may, for example, be induced by the use of weights or wax forms. However, these methods of adding curvature tend to require that each wafer be set up individually; that is, they are manual, single-wafer solutions. Throughput is low, and attention is required during wet etching.

SUMMARY

Embodiments of the invention provide methods for performing ELO with III-V growth substrates that require less individual setup and provide greater throughput than conventional ELO methodologies.

Aspects of the invention are directed a method for performing ELO. A sample is received comprising a growth substrate with a top surface, a sacrificial layer on the top surface, and a device layer on the sacrificial layer. This sample is supported inside a container, and the container is filled with a wet etchant such that the wet etchant progressively etches away the sacrificial layer and the device layer lifts away from the growth substrate. While filling the container with the wet etchant, the sample is supported in the container such that the top surface of the growth substrate is non-parallel with an uppermost surface of the wet etchant.

Moreover, additional aspects of the invention are directed to an electronic device formed at least in part utilizing the method presented in the previous paragraph.

Lastly, even additional aspects of the invention are directed to performing ELO by initially preparing a sample at least in part by receiving a growth substrate with a top surface, forming a sacrificial layer on the top surface, and forming a device layer on the sacrificial layer. This sample is supported inside a container and the container is filled with a wet etchant such that the wet etchant progressively etches away the sacrificial layer and the device layer lifts away from the growth substrate. During the filling of the container, the sample is supported in the container such that the top surface of the growth substrate is non-parallel with an uppermost surface of the wet etchant.

Techniques of the present invention can provide substantial beneficial technical effects. By way of example only and without limitation, one or more embodiments may provide one or more of the following advantages:

- allows an epitaxial layer to be removed from its original substrate and transferred to a new one, thereby avoiding the high cost of III-V devices by reusing the substrates;
- can be applied in cases where a direct etching of structural material would have undesirable effects on the layer below; and
- requires little individual setup of the sample, and is capable of batch processing and high throughput.

BRIEF DESCRIPTION OF THE DRAWINGS

These and other features, aspects, and advantages of the present invention will become better understood with regard to the following description, appended claims, and accompanying drawings where:

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

The present invention will be described with reference to illustrative embodiments. For this reason, numerous modifications can be made to these embodiments and the results will still come within the scope of the invention. No limitations with respect to the specific embodiments described herein are intended or should be inferred.

As the term is used herein and in the appended claims, "about" means within plus or minus ten percent. Moreover, "III-V materials" and "III-V films" are materials and films, respectively, that comprise a combination of at least one Group III element (e.g., aluminum (Al), gallium (Ga), and indium (In)) and at least one Group V element (e.g., nitrogen (N), phosphorus (Ph), arsenic (As), and antimony (Sb)).

Figure 1:
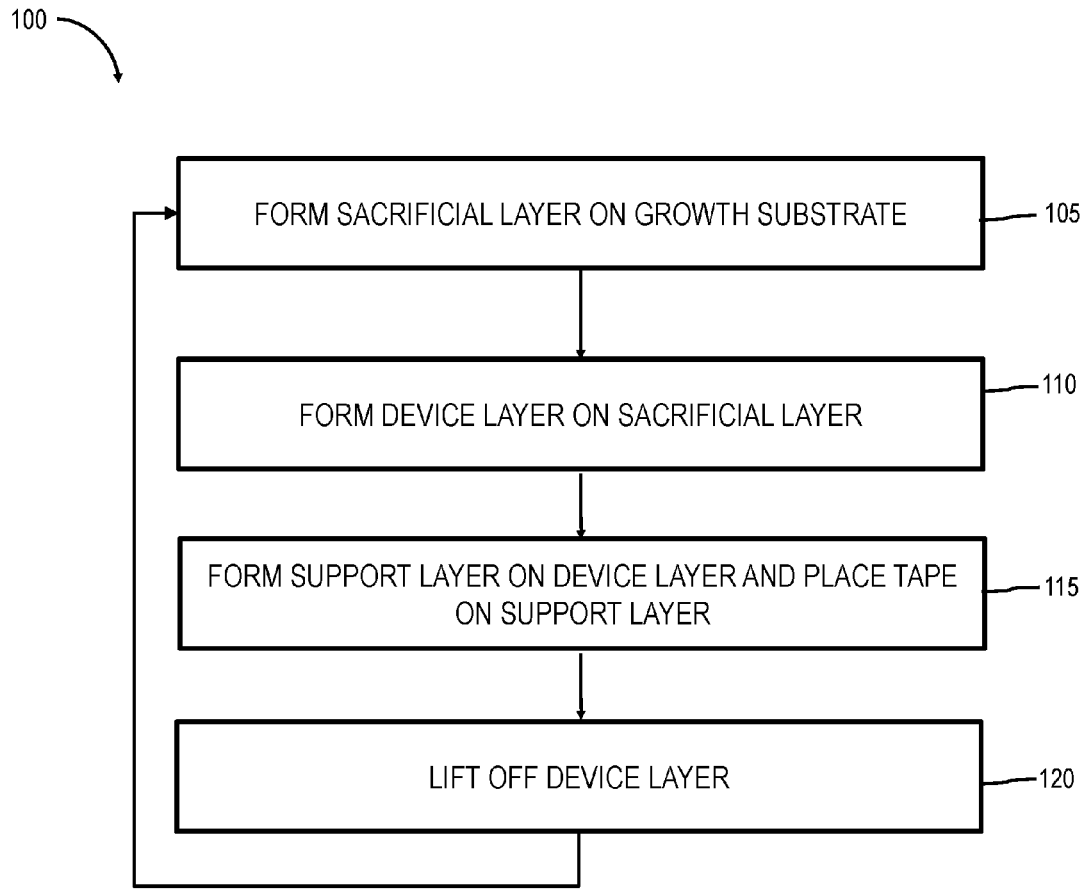
FIG. 1 provides a flow diagram of an exemplary method for performing ELO, in accordance with an embodiment of the invention.

FIG. 1 shows a flow diagram of an exemplary method 100, according to an embodiment of the invention for performing ELO while fabricating semiconductor devices. FIGS. 2-5, moreover, show sectional views of intermediate samples formed during this processing. Although the method 100 and the structures formed thereby are entirely novel, at least some of the individual processing steps required to implement the method 100 may utilize conventional semiconductor fabrication techniques and/or conventional semiconductor fabrication tooling. These techniques and tooling will already be familiar to one having ordinary skill in the relevant arts given the teachings herein. In addition, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are both hereby incorporated by reference herein. It is again emphasized that, while some individual processing steps are set forth herein, those steps are merely illustrative and one skilled in the art may be familiar with several equally suitable alternatives that would also fall within the scope of the invention.

Figure 2:
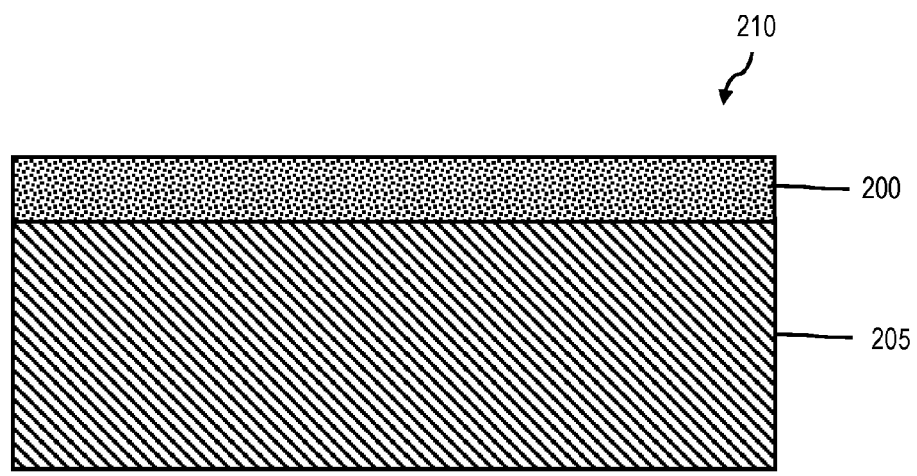
FIGS. 2-5 show sectional views of intermediate samples formed when performing the FIG. 1 method.

The exemplary method 100 starts in step 105 with the forming of a sacrificial layer 200 on a growth substrate 205, which yields a sample 210 shown in FIG. 2. The growth substrate 205 may, for example, comprise a gallium arsenide wafer. The sacrificial layer 200 may, in turn, comprise aluminum arsenide epitaxially grown on the growth substrate 205. As will be further detailed below, aluminum arsenide is a good choice for the sacrificial layer 200 because it is susceptible to being etched by hydrofluoric acid at reasonably high etch rates and with extremely good selectivity to other III-V materials.

The epitaxial growth of the sacrificial layer 200 on the growth substrate 205 in step 105, and, more generally, the epitaxial growth of all of the III-V materials described herein, may be performed by, for example, metal-organic chemical vapor deposition (MOCVD) (also called metal-organic vapor phase epitaxy (MOVPE)). During MOCVD, the growth surface is exposed to vapor-phase metal-organic reactants while being heated (e.g., to 650° C.). Reactor pressure may be around 100 Torr, and high purity nitrogen may be employed as the carrier gas, in one or more embodiments. Trimethyl gallium, trimethyl aluminum, and trimethyl indium may be used as Group III precursors, while arsine and phosphine may be used as Group V precursors. Disilane and dimethyl zinc may be utilized to provide n-type and p-type doping, respectively, although other dopants are similarly contemplated. Commercial MOCVD reactors are available from several sources, including, for example, Thomas Swan & Co., Ltd. (Consett, UK), who manufactures a suitable close-coupled showerhead cold-wall MOCVD system.

Figure 3:
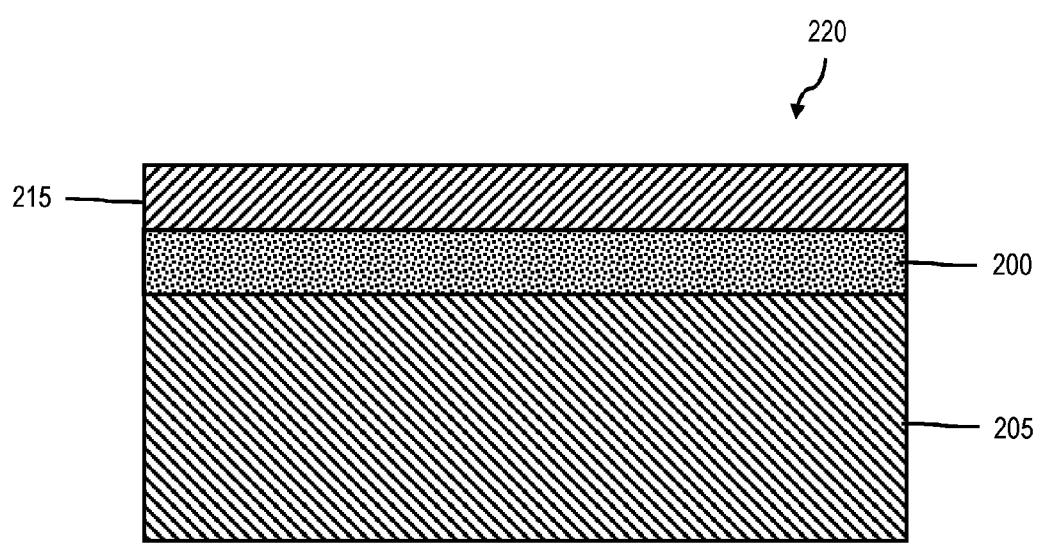

Step 110 involves forming a device layer 215 on the just-deposited sacrificial layer 200 to achieve a sample 220 shown in FIG. 3. Initial processing may, for example, include epitaxially growing a stack of III-V films. For example, when forming a solar cell, the device layer 215 may initially include a film stack comprising n- and p-type gallium arsenide, n- and p-type aluminum gallium arsenide, etc. Film thicknesses may vary from about 20 nanometers to about two micrometers, although the precise thicknesses will depend on the application. Again, MOCVD may be used for the epitaxial deposition, with the resultant III-V thin films lattice-matched to the underlying growth substrate 205. After epitaxy, the device layer 215 may be further processed to form active devices. For example, conventional photolithography, metal evaporation (e.g., silver, gold, nickel), and reactive ion etching (RIE) may be used to pattern the thin films and to create metallic lines and contacts, as desired.

Figure 4:
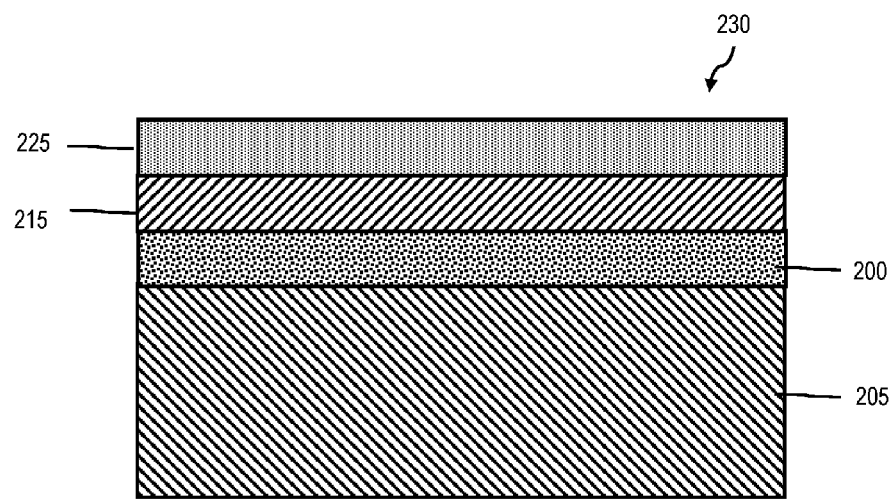
Figure 5:
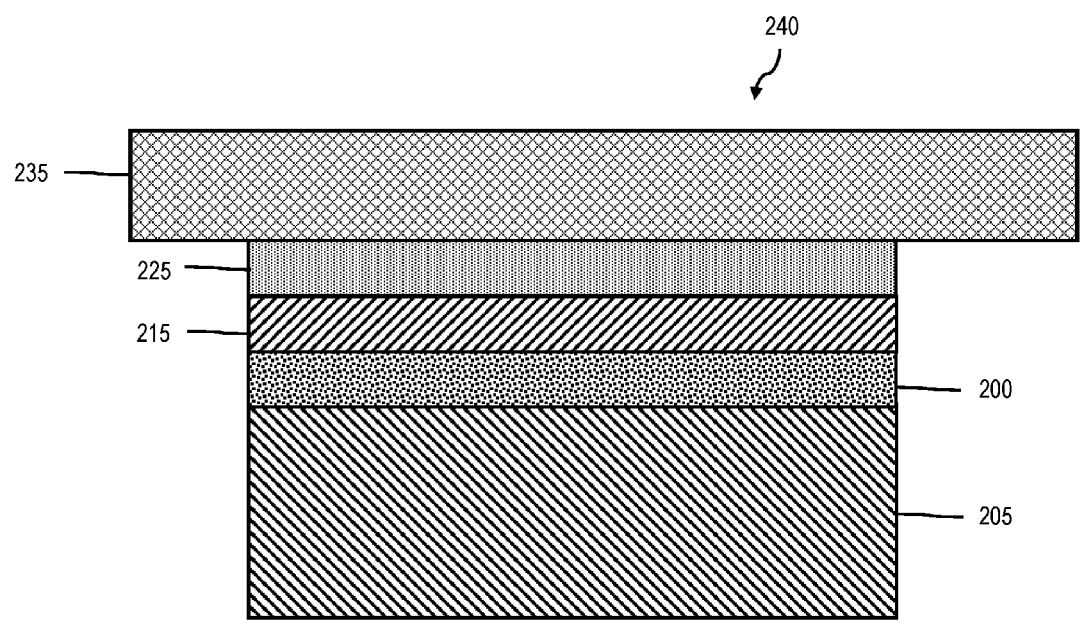

With the device layer 215 formed in step 110, step 115 involves preparing the sample 220 for a lift-off process. In the present embodiment, a support layer 225 is first added to the top of the sample 220 such that the support layer 225 is disposed on the top of the device layer 215. A resultant sample 230 is shown in FIG. 4. Next, a piece of tape 235 is adhered to the top of the support layer 225, yielding a sample 240 shown in FIG. 5.

Both the support layer 225 and the tape 235 aid in handling the sample 240 before it is lifted off and handling the device layer 215 after lift-off. The support layer 225 preferably comprises a material that can withstand being immersed in hydrofluoric acid without significant etching. It may comprise, for example, a photoresist material such as, but not limited to, polymethyl methacrylate (PMMA) and SU-8. Photoresist may be deposited by conventional photoresist spin-on techniques. Alternatively, the support layer 225 may comprise metals like copper, gold, and nickel, which are also inert in hydrofluoric acid.

Figure 6A:
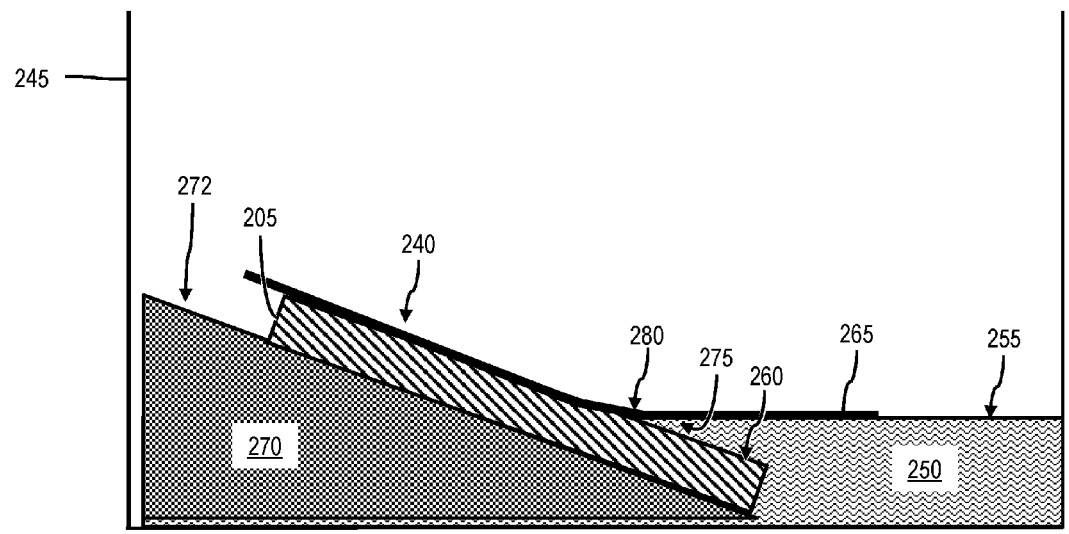
FIGS. 6A and 6B show side-view representations of a lift-off process while performing the FIG. 1 method.
Figure 6B:
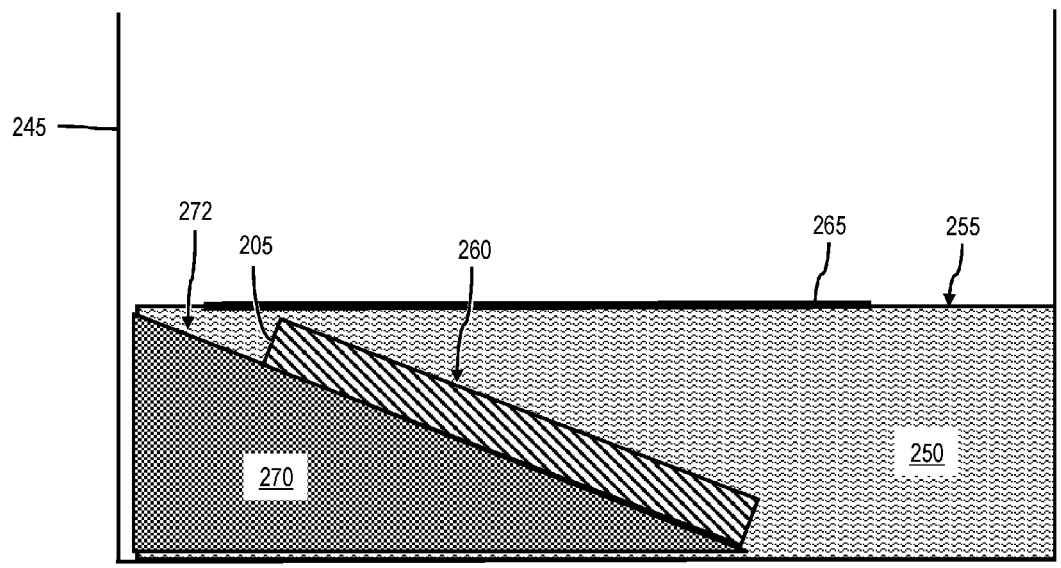

Step 120 includes actually performing the lift-off process. The lift-off process involves supporting the sample 240 from FIG. 5 in a container and then filling the container with a wet etchant to progressively etch away the sacrificial layer 200 and cause the device layer 215 to lift away from the growth substrate 205. FIGS. 6A and 6B show side-view representations of such a lift-off process at two temporal points in the process. In FIG. 6A, a container 245 is filled with a wet etchant 250 to the point where about one-third of the growth substrate 205 of the sample 240 is immersed in the wet etchant 250, while, in FIG. 6B, the container 245 is filled to the point where the growth substrate 205 is completely immersed in the wet etchant 250. Notably, while filling the container 245, the growth substrate 205 is supported in the container 245 such that a top surface 260 of the growth substrate 205 is non-parallel with an uppermost surface 255 of the wet etchant 250. As the container 245 is filled with the wet etchant 250, the wet etchant 250 progressively removes the sacrificial layer 200 and causes the device layer 215, the support layer 225, and the tape 235 (hereinafter, collectively the "lift-off layer" 265) to lift away the growth substrate 205 and to float on the uppermost surface 255 of the wet etchant 250 as a result of surface tension.

During this processing, the growth substrate 205 is held at an angle relative to the uppermost surface 255 of the wet etchant 250 via a support 270 on which the growth substrate 205 rests. The support includes an angled surface 272 that is oblique to a bottom of the container 245. As the container 245 is filled with the wet etchant 250, an etch front 275 is created at an edge of the sacrificial layer 200 as the wet etchant 250 progressively moves up the growth substrate 205. At the same time, surface tension causes the lift-off layer 265 to pull away from the growth substrate 205 and to float to the uppermost surface 255 of the wet etchant 250, effectively creating a bend 280 in the lift-off layer 265 at the etch front 275 (FIG. 6A). That is, the bend 280 is formed in the device layer 215 (constituting part of the lift-off layer 265) between a portion of the device layer 215 still disposed on the sacrificial layer 200 and a portion of the device layer 215 that has already lifted away from the growth substrate 205. Once floating at the uppermost surface 255 of the wet etchant 250, the lift-off layer 265 adopts an essentially flat orientation due to surface tension (FIG. 6B).

Hydrofluoric acid may etch aluminum arsenide very selectively to other III-V materials. In some measurements, for example, etch rates in aluminum oxide are estimated to be over eight orders-of-magnitude higher in aluminum arsenide than they are in III-V materials containing significant amounts of gallium. Thus aluminum arsenide is a good choice for the sacrificial layer 200, and hydrofluoric acid is a good candidate for use as the wet etchant 250.

Aqueous hydrofluoric acid (HF(aq)) is understood to etch solid aluminum arsenide (AlAs(s)) via two major reactions:

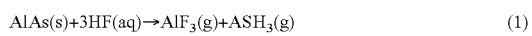
$$AlAs(s)+3HF(aq) \rightarrow AlF_3(g)+AsH_3(g) \qquad (1)$$

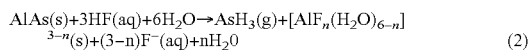
$$AlAs(s)+3HF(aq)+6H_2O \rightarrow AsH_3(g)+[AlF_n(H_2O)_{6-n}]^{3-n}(s)+(3-n)F^-(aq)+nH_2O \qquad (2)$$

In both cases, arsine gas (AsH$_3$(g)) is a reaction byproduct and may create bubbles at the etch front 275 that can inhibit continued etching. Nevertheless, in the present lift-off process, the bend 280 in the lift-off layer 265 at the etch front 275 increases the space at the etch front 275 between the lift-off layer 265 and the growth substrate 205, increasing the rate of etchant diffusion to the etch front 275 and reducing the chances of bubbles affecting etch rate in this critical region. The bend 280 thereby "guides" the etching process and insures that the etch can be maintained across the entire growth substrate 205 so as to fully detach and float the lift-off layer 265. In fact, the bend 280 benefits the present lift-off process in a manner somewhat similar to that in which induced curvature benefits conventional ELO processes. But in contrast to ELO processes wherein curvature must be induced in the sample, ELO in accordance with aspects of the invention depends on the natural surface tension of the wet etchant 250 to create the bend 280. ELO processing in accordance with aspects of the invention therefore avoids the individual setup efforts and low throughputs associated with using curvature-inducing techniques involving such elements as weights and wax. In fact, the method 100, and, more generally, process embodiments within the scope of the invention, lend themselves easily to batch processing wherein a plurality of samples are processed simultaneously in a single container.

While filling the container 245 with the wet etchant 250, the rate of filling the container 245 with the wet etchant 250 (the "fill rate") is preferably controlled so that the uppermost surface 255 of the wet etchant 250 does not rise higher than the etch front 275. That is, the container 245 is preferably filled with the wet etchant 250 at a rate that does not allow the uppermost surface 255 of the wet etchant 250 to climb higher on the growth substrate 205 than the etch front 275 of the sacrificial layer 200. This assures that the lift-off is well-controlled all the way through the process and the potential for forming more than one etch front is mitigated. At the same time, it is noted that, in addition to the fill rate, the angle of the sample 240 also acts to determine how fast the etch front 275 moves along the growth substrate 205, with a larger angle causing the etch front 275 to move more slowly for a given fill rate. Accordingly, this angle too becomes a "knob" by which to control the lift-off process. In actual reduction to practice, the angle can be modified merely by modifying the angled surface 272 of the support 270.

While a sacrificial layer 200 comprising aluminum arsenide is set forth above, it is reinforced that this choice of materials, like all the specific material choices described herein, is merely by way of illustration and other equally suitable material may be utilized. In one or more alternative embodiments, for example, the sacrificial layer 200 may comprise an indium-containing phosphide material (e.g., InGaP, InAlP, InP). Such phosphides have been widely applied as etch stop layers for the selective etching of arsenide materials, and vice versa, and it is known that these indium-containing phosphides may be selectively etched in hydrochloric acid by a reaction such as:

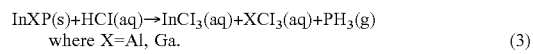
$$InXP(s)+HCl(aq) \rightarrow InCl_3(aq)+XCl_3(aq)+PH_3(g)$$
$$\text{where } X=Al, Ga. \qquad (3)$$

Additional details concerning performing EPO with a non-hydrofluoric-acid wet etchant are provided in U.S. Pat. No. 8,796,120 to Cheng et al. and entitled "High throughput epitaxial lift off for flexible electronics," which is hereby incorporated by reference herein. Thus, there are several alternatives as to the material for the sacrificial layer 200 as well as the wet etchant 250, and these alternatives would also come within the scope of the invention.

Figure 7:
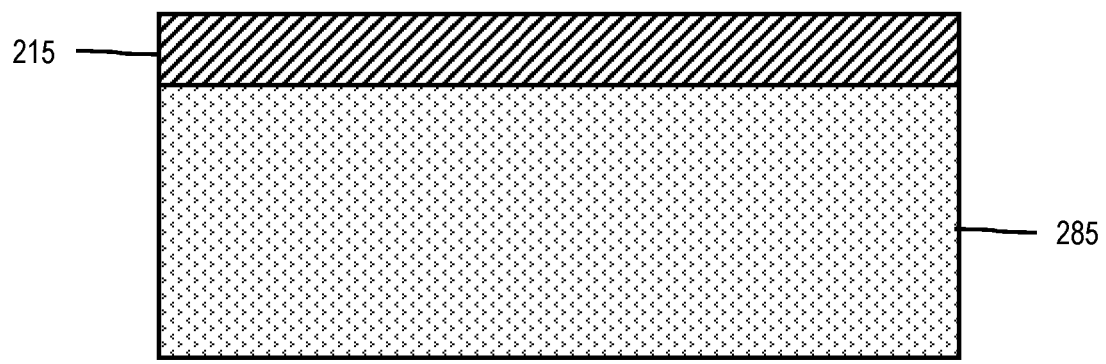
FIG. 7 shows a sectional view of a device layer formed using the FIG. 1 method after being mated to a different substrate.

Once the lift-off layer 265 is liberated from the growth substrate 205 in step 120, the device layer 215 may be mated with a different substrate, and the support layer 225 and tape 235 removed. The results of such additional processing are shown in FIG. 7, which shows a sectional view of the device layer 215 mated with a different substrate 285. Mating with the different substrate 285 may be accomplished via surface tension forces or "Van der Waals bonding." The device layer 215 may then be even further processed if so desired. Notably, the different substrate 285 need no longer contain III-V material such as gallium arsenide capable of supporting III-V epitaxy. Rather, the different substrate 285 may be independently optimized for one or more of dielectric constant, thermal conductivity, cost, weight, radiation hardness, mechanical strength, flexibility, and so forth. Thus, devices formed by novel ELO processing in accordance with aspects of the invention may be used in a wide range of applications.

At the same time, after the lift-off process in step 120, the growth substrate 205 may be reused to again fabricate III-V devices by simply starting again at step 105 in the method 100 (as indicated by the return arrow between step 120 and step 105 in FIG. 1). This recycling can continue indefinitely. Accordingly, aspects of the invention provide a high yield and high throughput method of performing ELO that allows the growth substrate to be reused over and over again.

The method 100 as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. These integrated circuits and end products would also fall within the scope of the invention.

In closing, it should again be emphasized that the above-described embodiments of the invention are intended to be illustrative only. Other embodiments may, for example, utilize different processing steps and materials from those expressly set forth above to achieve embodiments falling within the scope of the invention.

All the features disclosed herein may be replaced by alternative features serving the same, equivalent, or similar purposes, unless expressly stated otherwise. Thus, unless expressly stated otherwise, each feature disclosed is one example only of a generic series of equivalent or similar features.

Any element in a claim that does not explicitly state "means for" performing a specified function or "step for" performing a specified function is not to be interpreted as a "means for" or "step for" clause as specified in AIA 35 U.S.C. §112(f). In particular, the use of "steps of " in the claims herein is not intended to invoke the provisions of AIA 35 U.S.C. §112(f).

Given the discussion thus far, it will be appreciated that an exemplary method for performing epitaxial lift-off includes the steps of: receiving a sample comprising a growth substrate with a top surface, a sacrificial layer on the top surface of the growth substrate, and a device layer on the sacrificial layer; supporting the sample inside a container; and filling the container with a wet etchant such that the wet etchant progressively etches away the sacrificial layer and the device layer lifts away from the growth substrate. The sample is supported in the container such that the top surface of the growth substrate is non-parallel with an uppermost surface of the wet etchant while filling the container with the wet etchant.

Given the discussion thus far, it will also be appreciated that, in general terms, an exemplary electronic device is formed at least in part by an epitaxial lift-off method set forth above.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary structures illustrated in the accompanying figures, or portions thereof, may be part of an integrated circuit. Integrated circuits so manufactured are considered part of this invention.

An integrated circuit in accordance with aspects of the present disclosure can be employed in essentially any application and/or electronic system in which it is desirable to avoid the high cost of III-V devices by reusing the substrates, or where a direct etching of structural material would have undesirable effects on the layer below. Applications that may benefit from the techniques described herein include, but are not limited to, the fabrication of solar cells. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. §1.72 (b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus, the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A method for performing epitaxial lift-off, the method comprising the steps of:
   providing a support structure having an upper surface which is angled relative to a bottom of a container;
   preparing a sample at least in part by:
      receiving a growth substrate with a top and bottom surface;
      forming a sacrificial layer on the top surface of the growth substrate; and
      forming a device layer on the sacrificial layer;
   supporting the sample whereby an entire bottom surface of the growth substrate rests on the upper surface of the support structure inside the container; and
   filling the container with a wet etchant such that the wet etchant progressively etches away the sacrificial layer and the device layer lifts away from the growth substrate;
   wherein the sample is supported in the container such that the top surface of the growth substrate is non-parallel with an uppermost surface of the wet etchant while filling the container with the wet etchant;
   wherein, while filling the container with the wet etchant, the bottom surface of the growth substrate is not in contact with the wet etchant; and
   wherein the support structure substantially fills an entire volume between the bottom of the container and the bottom surface of the growth substrate.

2. The method of claim 1, wherein forming a device layer comprises epitaxial growth of a III-V material that is lattice matched to the growth substrate.

3. A method for performing epitaxial lift-off, the method comprising the steps of:
   providing a support structure having an upper surface which is angled relative to a bottom of a container;
   receiving a sample comprising:
      a growth substrate with a top and bottom surface;
      a sacrificial layer on the top surface of the growth substrate; and
      a device layer on the sacrificial layer;
   supporting the sample whereby an entire bottom surface of the growth substrate rests on the upper surface of the support structure inside the container; and
   filling the container with a wet etchant such that the wet etchant progressively etches away the sacrificial layer and the device layer lifts away from the growth substrate;
   wherein the sample is supported in the container such that the top surface of the growth substrate is non-parallel with an uppermost surface of the wet etchant while filling the container with the wet etchant;
   wherein, while filling the container with the wet etchant, the bottom surface of the growth substrate is not in contact with the wet etchant; and
   wherein the support structure substantially fills an entire volume between the bottom of the container and the bottom surface of the growth substrate.

4. The method of claim 3, wherein the growth substrate comprises a III-V material.

5. The method of claim 3, wherein the growth substrate comprises gallium arsenide.

6. The method of claim 3, wherein the sacrificial layer comprises aluminum arsenide.

7. The method of claim 3, wherein the device layer comprises a III-V material that is lattice matched to the growth substrate.

8. The method of claim 3, wherein the sample further comprises a support layer disposed on an upper surface of the device layer.

9. The method of claim 8, wherein the support layer comprises at least one of a photoresist and a metal.

10. The method of claim 8, wherein the sample further comprises tape disposed on an upper surface of the support layer.

11. The method of claim 3, wherein the wet etchant comprises hydrofluoric acid.

12. The method of claim 3, wherein the sacrificial layer is characterized by an etch rate in the wet etchant greater than the etch rate of a remainder of the sample while filling the container with the wet etchant.

13. The method of claim 3, wherein supporting the sample inside the container comprises supporting the sample on an angled surface oblique to a bottom of the container.

14. The method of claim 3, wherein filling the container with the wet etchant comprises filling the container at a rate that does not allow the uppermost surface of the wet etchant to climb higher on the growth substrate than an etch front of the sacrificial layer.

15. The method of claim 3, wherein the device layer floats on the wet etchant due to surface tension after lifting away from the growth substrate.

16. The method of claim 3, wherein, while filling the container with the wet etchant, a bend is formed in the device layer between a portion of the device layer still disposed on the sacrificial layer and a portion of the device layer that has already lifted away from the growth substrate.

17. The method of claim 3, further comprising the step of reattaching the device layer to a different substrate.

18. The method of claim 3, further comprising the step of reusing the growth substrate in a subsequent epitaxial lift-off process.

* * * * *